United States Patent [19]

Otto

[11] 4,017,813
[45] Apr. 12, 1977

[54] SURFACE ACOUSTIC WAVE NOTCH FILTER

[75] Inventor: Oberdan W. Otto, Los Angeles, Calif.

[73] Assignee: Hughes Aircraft Company, Culver City, Calif.

[22] Filed: Apr. 5, 1976

[21] Appl. No.: 673,322

[52] U.S. Cl. .................. 333/72; 310/8.2; 333/30 R
[51] Int. Cl.² ............ H03H 9/26; H03H 9/30; H01L 41/04
[58] Field of Search ............ 333/30 R, 72, 71; 310/8, 8.1, 8.2, 9.8, 9.7

[56] References Cited

UNITED STATES PATENTS

| | | | |
|---|---|---|---|
| 3,568,102 | 3/1971 | Tseng | 333/30 R |
| 3,753,164 | 8/1973 | De Vries | 333/30 R |
| 3,946,338 | 3/1976 | Schmidt | 333/30 R |

OTHER PUBLICATIONS

B534,991, Jan. 1976, Weglein, 333/72.

*Primary Examiner*—Alfred E. Smith
*Assistant Examiner*—Marvin Nussbaum
*Attorney, Agent, or Firm*—John Holtrichter, Jr.; W. H. MacAllister

[57] ABSTRACT

A surface acoustic wave device including a synchronous reflection array disposed in a delay line between the input and output transducers, the synchronous reflection array having a synchronous reflection frequency that distorts the beam profile of propagating surface acoustic wave energy in the delay line so that when the beam profile is amplitude averaged at the output transducer, the transducer output signal has a relatively deep notch in amplitude at the synchronous reflection frequency.

1 Claim, 2 Drawing Figures

SURFACE ACOUSTIC WAVE NOTCH FILTER

BACKGROUND OF THE INVENTION

The background of the invention will be set forth in two parts.

1. FIELD OF THE INVENTION

The invention relates to surface acoustic wave devices and more particularly to surface acoustic wave notch filters.

2. DESCRIPTION OF THE PRIOR ART

Conventional LC circuits and most known active filter techniques have generally not proven to be very successful in VHF notch filter applications. In the past, surface acoustic wave devices have been designed to provide this valuable function. Basically, the most advantageous type of this class of notch filter uses nulls in transducer responses which occur periodically in frequency and thus cannot be arbitrarily placed. As can be seen, this is very limiting and an efficient surface acoustic wave notch filter that can be designed to provide a deep notch characteristic at any desired frequency in the pass band of a delay line would constitute a significant advancement of the art.

SUMMARY OF THE INVENTION

In view of the foregoing factors and conditions characteristic of the prior art, it is a primary object of the present invention to provide an improved surface acoustic wave notch filter.

Another object of the present invention is to provide an easily fabricated surface acoustic wave notch filter having one or more arbitrarily placed notches in the pass band of the device.

Still another object of the present invention is to provide a surface acoustic wave notch filter exhibiting a clean, narrow band, and deep notch that is isolated in frequency and otherwise independent of the surface acoustic wave delay line transducer pass band which it modifies.

In accordance with one embodiment of the present invention, a surface acoustic wave notch filter is provided having a surface acoustic wave delay line including a substrate of material capable of supporting propagating surface acoustic wave energy and including spaced input and output transducers disposed on the substrate, the input transducer converting electromagnetic energy to a beam of surface acoustic wave energy having a surface displacement beam profile and propagating in the substrate along a predetermined path toward the output transducer. The invention also has synchronous reflection means including a periodic angled reflective array having a synchronous reflection frequency and disposed on the substrate in the aforementioned predetermined path for distorting the beam profile of the beam and causing selective portions thereof adjacent the synchronous reflection frequency to be out of phase with the remainder of the beam profile. The beam profile is amplitude averaged at the output transducer to provide an output signal having a relatively deep notch in amplitude at the synchronous reflection frequency.

The synchronous reflective array may consist of ion-etched grooves (topographic), mass loading reflectors, or thin film metal reflectors on a piezoelectric substrate material.

The features of the present invention which are believed to be novel are set forth with particularity in the appended claim. The present invention, both as to its organization and manner of operation, together with further objects and advantages thereof, may best be understood by making reference to the following description taken in conjunction with the accompanying drawings, in which like reference characters refer to like elements in the several views.

DESCRIPTION OF THE PREFERRED EMBODIMENT

Figure 1:
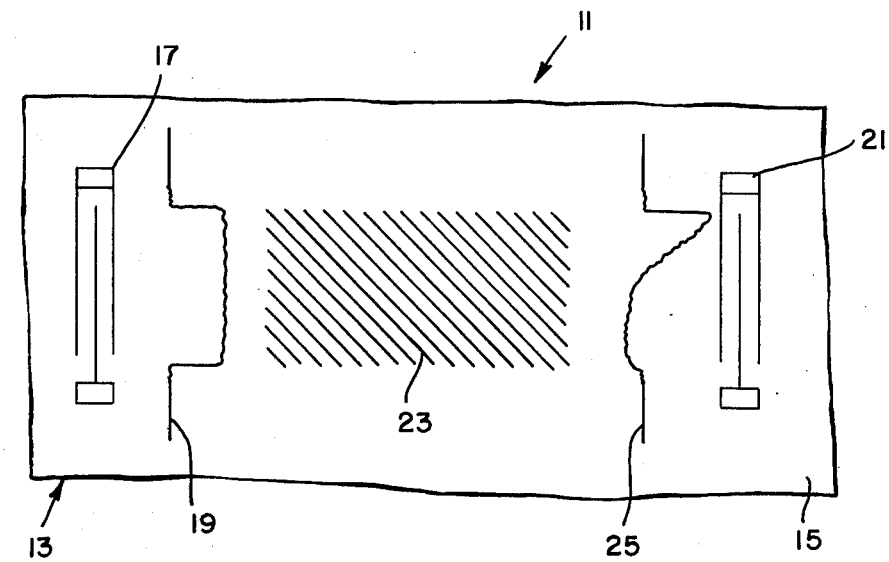
FIG. 1 is a schematic plan view of a surface acoustic wave notch filter in accordance with the present invention.

Referring now to the drawing and more particularly to the surface acoustic wave notch filter 11 of FIG. 1, there is shown a delay line structure 13 including a substrate 15 of material such as lithium niobate, for example, capable of supporting propagating surface acoustic wave energy. Disposed on the substrate 15 is a conventional input transducer 17 capable of converting electromagnetic energy to a beam of surface acoustic wave energy having a surface displacement beam profile as illustrated graphically at 19. The beam progagates in the substrate along a predetermined path toward a conventional output transducer 21 which converts surface wave energy incident thereon to output electromagnetic energy.

Figure 2:
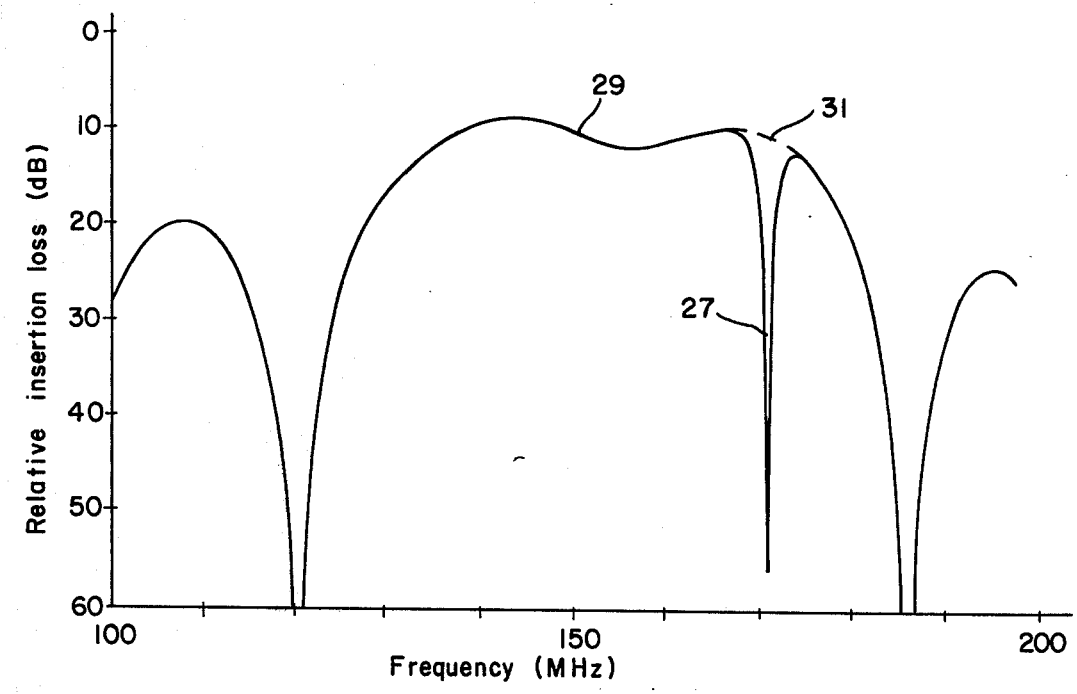
FIG. 2 is a graphical illustration of the frequency pass band for the device of FIG. 1 showing a notch produced by the synchronous reflection means incorporated in the delay line structure.

Disposed on the substrate 15 in the aforesaid beam path, is a periodic angled reflective array 23 having a synchronous reflection frequency. A detailed report on the computation of resonance frequencies for this type of array is found in an article by Oberdan W. Otto entitled "Phase-Matching Condition for Scattering From Acoustic Surface Reflective Arrays," in Applied Physics Letters, Vol. 26, No. 5, Mar. 1, 1975. The array 23 distorts the the beam profile of the beam, as shown graphically at 25, and causes selective portions thereof, adjacent the synchronous reflection frequency, to be out of phase with the remainder of the beam profile. The beam profile is amplitude averaged by the output transducer 21 to provide thereat an electrical output signal having a relatively deep (45 dB) amplitude notch 27 in the frequency pass band 29 at the synchronous reflection frequency, as illustrated in FIG. 2. The dashed line 31 indicates the shape of the pass band frequency response of the delay line 13 if the periodic reflective array 23 were not present.

The stripe reflectivity and array geometry cause the deep notch in frequency response of the delay line at the frequency for synchronous reflection from the array without actually reflecting an appreciable fraction of the energy from the incident beam. At the notch center frequency, the average amplitude at the output transducer 21 is close to zero, although the rms amplitude may be finite. Mathematically, this may be expressed as $$\int A(x)dx = \overline{A} \approx 0$$

$$\int \sqrt{|A(x)|^2} \, dx = A_{rms} \neq 0,$$

where $A(x)$ is the amplitude of the beam at the output transducer, where $x$ is the position across the transducer aperture, and where $|A(x)|^2$ is proportional to the power density in the beam.

When multiple reflections are important, the reflective array 23 distorts the beam profile causing parts of the profile to be out of phase with the rest. This occurs only near the frequency for synchronous reflection. The beam is unaffected by the reflective array at other frequencies. In a construction of the invention, the device exhibited a 45 dB notch with only about half of the power reflected out of the main beam.

The reflective array 23 may consist of ion-etched grooves (topographic), mass loading reflectors, or thin film metal reflectors on a piezoelectric substrate. As can be seen, the reflector type is not important. However, the size of the single stripe reflection coefficient and the array geometry (length and width) are of importance. For a detailed explanation of this aspect of the present invention, reference is made to an article entitled "Multiple Reflections in Acoustic Surface Wave Reflective Arrays" by Oberdan W. Otto in IEEE Transactions on Sonics And Ultrasonics, Vol. SU-22, No. 4, July 1975.

The reflection need not be into the same type of wave as the incident wave (e.g. Z-Rayleigh to X-Rayleigh on Y-cut LiNbO$_3$). However, it must be a wave which is confined to the surface so that multiple reflections can occur (e.g. A-Rayleigh to X-pseudo surface from metal reflectors). Reference is here made to an article in Electronic Letters, Sept. 5, 1974, Vol. 10, No. 18, by Oberdan W. Otto and Rolf D. Weglein. Reflections into bulk waves cannot give rise to multiple reflections since the reflected waves propagate away from the reflective array.

From the foregoing it should be evident that the invention is a surface acoustic wave implementation of a notch filter which is narrow band, deep, isolated in frequency, and otherwise independent of the acoustic surface wave transducer pass band. The device makes use of distortion of the beam profile of the transmitted surface acoustic wave caused by multiple reflections in the synchronous array. The device is easily fabricated, and if, for example, the reflective array is thin film aluminum on LiNbO$_3$, then the transducers and grating array can be fabricated in the same lithographic step. Many arbitrarily placed notches can be made in the same device, which notches are very clean and very deep, typically greater than 40 dB.

It should be understood that the materials and processes described in fabricating the invention are not critical, and other materials and processes exhibiting similar desired characteristics and providing functionally similar structures may be substituted for those mentioned.

Although the present invention has been shown and described with reference to a particular embodiment, nevertheless various changes, modifications and embodiments which are obvious to persons skilled in the art to which the invention pertains are deemed to lie within the spirit, scope and contemplation of the invention.

What is claimed is:

1. A surface acoustic wave notch filter, comprising:
    a surface acoustic wave delay line including a substrate of material capable of supporting propagating surface acoustic wave energy and including spaced input and output transducers disposed on said substrate, said input transducer converting electromagnetic energy to a beam of surface acoustic wave energy having a surface displacement beam profile and propagating in said substrate along a predetermined path toward said output transducer; and
    synchronous reflection means including a periodic angled reflective array having a synchronous reflection frequency and disposed on said substrate in said predetermined path for distorting said beam profile of said beam and causing selective portions thereof adjacent said synchronous reflection frequency to be out of phase with the remainder of said beam profile, said beam profile being amplitude averaged at said output transducer to provide thereat an output signal having a relatively deep notch in amplitude at said synchronous reflection frequency.

* * * * *